Figure 1:
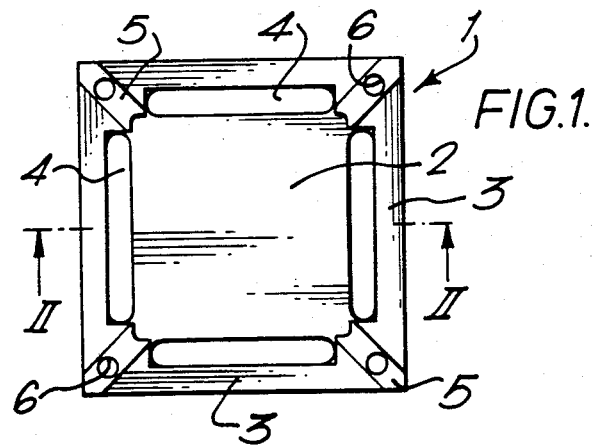

United States Patent [19]

van Dijk

[11] Patent Number: 4,498,721
[45] Date of Patent: Feb. 12, 1985

[54] ELECTRICAL CONNECTOR FOR AN ELECTRONIC PACKAGE

[75] Inventor: Petrus R. M. van Dijk, Hertogenbosch, Netherlands

[73] Assignee: AMP Incorporated, Harrisburgh, Pa.

[21] Appl. No.: 523,504

[22] Filed: Aug. 15, 1983

[30] Foreign Application Priority Data

Sep. 16, 1982 [GB] United Kingdom ............... 8226446

[51] Int. Cl.³ .............................................. H01R 9/09
[52] U.S. Cl. ............................. 339/75 MP; 339/17 CF
[58] Field of Search .......... 339/17 CF, 75 MP, 75 M, 339/176 MP, 176 M

[56] References Cited

U.S. PATENT DOCUMENTS

| | | | |
|---|---|---|---|
| 3,877,064 | 4/1975 | Scheingold et al. | 357/74 |
| 3,940,786 | 2/1976 | Scheingold et al. | 357/74 |
| 3,960,423 | 6/1976 | Weisenburger | 339/17 CF |
| 4,035,046 | 7/1977 | Kloth | 339/17 CF |
| 4,166,665 | 9/1979 | Cutchaw | 339/17 CF |
| 4,220,383 | 9/1980 | Scheingold et al. | 339/17 CF |
| 4,278,311 | 7/1981 | Scheingold et al. | 339/17 CF |
| 4,390,220 | 6/1983 | Benasutti | 339/17 CF |

Primary Examiner—John McQuade
Attorney, Agent, or Firm—Katherine A. Nelson

[57] ABSTRACT

A connector for mounting a planar leadless electronic package (100) on a substrate (300) comprises a housing (1) carrying elastomeric contact structures (200), and a spring lid (7) which in use engages a package (100) in the connector and urges it towards the substrate (300), the lid (7) having portions (11) which engage with bolts (12) by which the connector is secured to the substrate (300) whereby the housing (1) is relieved of forces in the lid (7).

3 Claims, 7 Drawing Figures

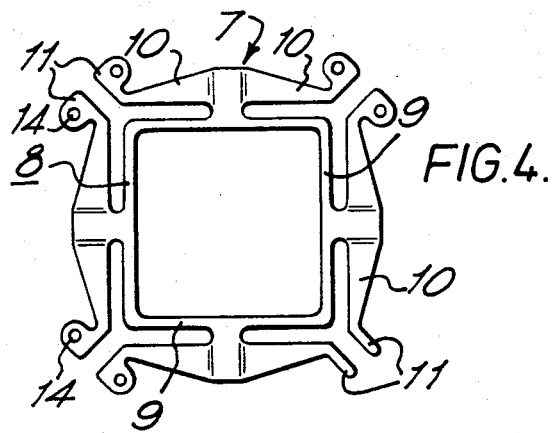
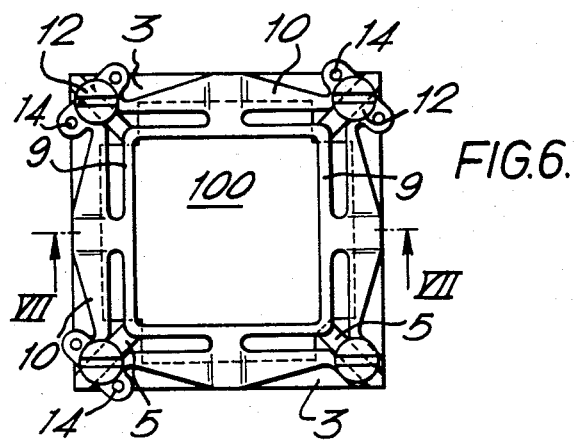

ELECTRICAL CONNECTOR FOR AN ELECTRONIC PACKAGE

This invention relates to an electrical connector for mounting a planar leadless electronic component package on a substrate.

Electronic components such as integrated circuit chips are frequently mounted on a planar electrically insulating substrate of, for example, ceramic material, the substrate having thereon conductors connected to contact points on the component, and serving for establishing connections between the component and external circuitry, such an assembly being referred to as a leadless package.

It is often necessary to mount such an electronic component and substrate leadless package on a further substrate such as a printed circuit board, with the conductors of the package electrically connected to conductors on the further substrate.

Many forms of electrical connector for effecting such mounting are well known, and a common type comprises a housing of electrically insulating material carrying a plurality of resilient electrical contacts providing first contact points for engagement with conductors on the package and second contact points for engagement with conductors on the substrate.

Such connectors are also known, which include a lid which when connected to the housing in a closed condition serves to urge a package mounted on the housing, into contact with the first contact points of the contacts, and to secure the package to the connector.

A difficulty which arises with known connectors is that since the conductors on the package are not resilient, the contact force between these conductors and the contacts is dependent solely upon the resiliency of the contacts, and the accuracy of the positioning of the contacts of the housing.

In Patent Publication GB-A-2008333 there is described such an electrical connector in which the lid carries spring members which engage a package mounted on the connector when the lid is closed, thereby to enhance the engagement between the first contact points of the contacts and the conductors on the package.

Thus, with this known connector the contact force between the package and the connector contacts is enhanced by the action of the spring members carried by the lid.

However, a disadvantage of this known connector is that the forces provided by the spring members carried by the lid, during use of the connector are all transferred to the housing and can cause distortion thereof, thus possibly having an adverse effect on the connections between the package and the connector contacts.

According to this invention a connector as discussed above is characterised in that the housing is formed at its periphery with a plurality of holes each to receive a bolt by which the connector is to be secured to the substrate, the lid being in the form of a spring member having a plurality of forked portions engageable under the heads of respective bolts when securing the connector to the substrate and having hold-down portions resilient relative to the forked positions and arranged to engage the package and hold the package on the housing.

The connector of this invention has the advantage that the forces deriving from the spring lid in use are applied to the package as required, but are not applied directly to the housing, the forces being transmitted by way of the bolts to the substrate on which the connector is mounted.

Figure 2:
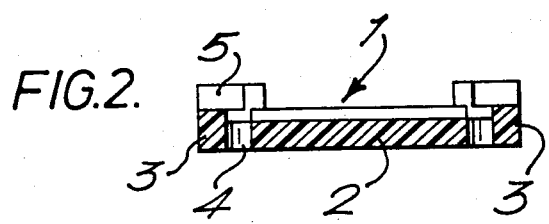
Figure 3:
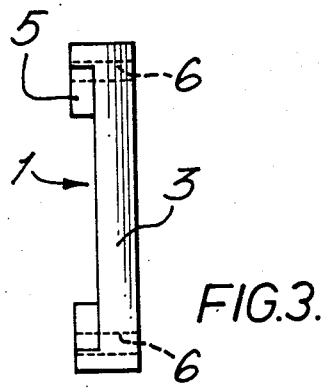

An electrical connector according to the invention will now be described by way of example with reference to the drawings in which:

FIG. 1 is a top plan view of the housing of the connector;
FIG. 2 is a section on the line II—II in FIG. 1;
FIG. 3 is a side view of the housing of FIG. 1;
FIG. 4 is a top plan view of the spring member lid of the connector;
FIG. 5 is a side view of the lid of FIG. 4;
FIG. 6 is a top plan view of the connector in the assembled state; and
FIG. 7 is a section on the line VII—VII in FIG. 6.

The connector to be described uses a contact structure comprising an elastomeric member carrying a plurality of conductive members, as described in European Patent Application No. 78 300349.4, Publication No. 0001477. An understanding of the exact form of the contact structure is not necessary for an understanding of the present invention, and the contact structure will not therefore be described in detail herein.

The connector comprises a housing 1 moulded from electrically insulating plastics material, and having a base 2 surrounded by four upstanding walls 3 joined at the corners of the base 2 but separated from the base 2 along the sides thereof by through slots 4. At the corners the walls 3 are formed with diagonally extending, upstanding ribs 5 each having a hole 6 therein, which extends completely through the housing.

Referring now to FIGS. 4 and 5, the connector also comprises a spring member lid 7 stamped from resilient metal and comprising an inner planar square frame 8 formed by four side strips 9 which in use serve as package holddown portions as will be described later. Each side strip 9 carries at its centre, and outside the frame 8, a pair of oppositely extending arms 10 which extend parallel to the side strip 9, as shown in FIG. 4, and upwardly relative to the plane of the frame 8, as shown in FIG. 5. A free end portion 11 of each arm 10 is turned outwardly to extend parallel to a diagonal of the frame 8 and at three corners of the lid 7 each is enlarged and formed with a hole 14, adjacent free end portions 11 being separated by a distance just greater than the width of the ribs 5 on the housing 1.

Referring now to FIGS. 6 and 7 also, for use of the connector, contact structures 200 as described in the European publication mentioned above are arranged in each of the slots 4 in the housing 1, to present contact surfaces upwards and downwards as seen in FIG. 7, and projecting beyond each of the major surfaces of the base 2.

Bolts 12 are then inserted into the holes 6 at the corners of the housing 1, the heads of the bolts 12 extending over the edges of the ribs 5 on the housing 1, and the bolts 12 extending right through the housing 1 and then through holes in a printed circuit board substrate 300 (FIG. 7). The connector is thus positioned on the substrate 300 with contacts of the contact structures 200 in contact with conductors (not shown) on the substrate 300.

Nuts 13 are then applied to the bolts 12 and tightened until the connector is firmly secured to the substrate 300, tightening of the nuts 13 drawing the heads of the bolts 12 down into contact with the ribs 5.

A package 100 as described above is then placed on the base 2 with contact areas of the package in contact with the contacts of the structures 200.

The spring member lid 7 is then placed over the package 100 with the frame 8 thereof engaging the package 100 and the forked portions constituted by the adjacent free end portions 11 of the arms 10 embracing the ribs 5 on the housing 1. The outer corners of the frame 8 of the lid 7 are radiused, as clearly shown in FIG. 4, and the inner corners of the housing 1 are similarly radiused, as shown in FIG. 1, whereby the lid 7 is accurately positioned on the housing 1.

The free end portions 11 of the arms 10 of the lid 7 are then urged under the heads of the bolts 12, for example by using a tool engaged in the holes 14, and the arms 10 of the lid 7 are thus closed-up towards the frame 8, and forces are built up in the lid 7, which forces are applied to the package 100 and serve to urge it into contact with the contact structures 200, and to urge these into contact with the conductors on the substrate 300. The required electrical connections between the package 100 and the substrate 300 are thus established.

The forces induced in the lid 7 are resisted by the bolts 12 and through them by the substrate 300, and thus no distorting forces are applied directly to the housing 1.

When the package 100 is to be removed, the lid 7 is released by disengaging the free end portions 11 of the arms 10 from under the heads of the bolts 12, for example using a tool engaged in the holes 14, and then removing the lid 7 whereafter the package 100 can be removed from the housing 1.

The connector of this invention is particularly advantageous when elastomeric contact structures are used to provide the required connections, as described above, since with such structures there is inherently a large redundancy in elastomeric material and contacts, and thus the forces exerted by the structure under compression by the lid are significantly greater than those required solely for providing the required connections between the package and the substrate, as would be provided if individual contacts were used for the connections.

What is claimed is:

1. An electrical connector for mounting a planar leadless electronic component package on a substrate, comprising a housing of electrically insulating material carrying a plurality of electrical contacts providing first contact points for engagement with conductors on the package and second contact points for engagement with conductors on the substrate, and a lid which when connected to the housing in a closed condition serves to urge a package mounted on the housing, into contact with the first contact points of the contacts, and to secure the package to the connector, characterised in that the housing is formed at its periphery with a plurality of holes each to receive a bolt by which the connector is to be secured to the substrate, the lid being in the form of a spring member having a plurality of forked portions engageable under the heads of respective bolts when securing the connector to the substrate and having hold-down portions resilient relative to the forked portions and arranged to engage the package and hold the package on the housing said lid being comprised of an inner planar frame formed by side strips which in use serve as package hold-down portions, each side strip carrying outside the frame a pair of oppositely extending arms which extend parallel to the side strip and upwardly relative to the plane of the frame, adjacent free end portions of the arms together constituting the forked portions engageable under the heads of the bolts.

2. A connector as claimed in claim 1, characterised in that the free end portions of the arms are each formed with a hole accessible when the portion is engaged under the head of the associated bolt.

3. A connector as claimed in claim 1, or claim 2, characterised in that the housing is formed with upstanding ribs about which the forked portions of the lid engage, the bolt-receiving holes passing through the ribs.

* * * * *